United States Patent [19]

Miekka et al.

[11] Patent Number: 4,804,430

[45] Date of Patent: Feb. 14, 1989

[54] METALLIZATION OF SUPPORT MEMBERS

[75] Inventors: Richard G. Miekka, Sudbury; Roswell E. Hubbard, Wayland; John F. McDermott, Framingham, all of Mass.; Philip J. Clough, Gorham, Me.

[73] Assignee: Dennison Manufacturing Company, Framingham, Mass.

[21] Appl. No.: 612,167

[22] Filed: May 21, 1984

[51] Int. Cl.$^4$ .................. B29C 65/44; B32B 31/16
[52] U.S. Cl. ...................... 156/233; 156/289
[58] Field of Search .............. 156/233, 289; 428/914

[56] References Cited

U.S. PATENT DOCUMENTS

| | | | |
|---|---|---|---|
| 2,984,597 | 5/1961 | Hennes | 156/233 |
| 3,080,270 | 3/1963 | Lorenz | 156/233 |
| 3,410,744 | 11/1968 | Böld et al. | 156/233 |
| 3,980,512 | 9/1976 | Rausér | 156/233 |
| 4,012,552 | 3/1977 | Watts | 156/233 |
| 4,288,275 | 9/1981 | Davis | 156/233 |
| 4,308,633 | 1/1982 | Van Huffel et al. | 428/914 |
| 4,353,766 | 10/1982 | Dani | 156/233 |
| 4,382,831 | 5/1983 | Clough et al. | 156/233 |
| 4,459,055 | 7/1984 | Asakura et al. | 428/914 |
| 4,465,538 | 8/1984 | Schmook | 156/233 |
| 4,473,422 | 9/1984 | Parker et al. | 428/914 |
| 4,479,997 | 10/1984 | Masterson et al. | 428/914 |
| 4,535,024 | 8/1985 | Parker | 428/914 |

FOREIGN PATENT DOCUMENTS

| | | | |
|---|---|---|---|
| 0141843 | 11/1979 | Japan | 156/233 |
| 0073731 | 6/1980 | Japan | 156/233 |

*Primary Examiner*—Willard E. Hoag
*Attorney, Agent, or Firm*—George E. Kersey; Arthur B. Moore; Barry D. Josephs

[57] ABSTRACT

Method and apparatus for the metallization of support members, such as paper sheeting and other cellulosic products. A metallic film is transferred to a preheated paper support from a plastic sheet carrier and adhered to the paper by a thermoplastic material. The carrier is typically of stabilized plastic with a releasably adhered film of metal. Separate metallic films may be transferred simultaneously from opposite sides of a preheated plastic sheet carrier to separate, preheated paper supports. Pressure is applied to the composite which is cooled, desirably by chilling, and the carrier stripped away to leave the desired metallic layer on the receiving surface of the paper support.

This transfer procedure overcomes the objections associated with metal foil laminates and is particularly suitable for metallizing support members, like paper, which are difficult to metallize directly because they release significant amounts of vapor during conventional vacuum metallization. The results are also superior to what is realized using an adhesive with dispersed metal particles, and the need for curing the adhesive is eliminated.

16 Claims, No Drawings

METALLIZATION OF SUPPORT MEMBERS

BACKGROUND OF THE INVENTION

This invention relates to the metallization of support members and, more particularly, to the metallization of cellulosic support members such as paper.

Metallization is a process in which a metallic material, such as aluminum, is applied to an underlying support member. This can be done by bonding a thin film of metallic foil to the surface of the support member. The bonding takes place using a suitable adhesive and the resulting product is a laminate of the support material and the foil.

Alternatively, metal is vaporized in a high vacuum using resistance, induction or an electron beam and forms a metallic layer on a support member. This procedure is suitable only for support members that do not contain significant amounts of moisture. When moisture is present, the vacuum draws vapors and other by-products which must be eliminated before subsequent metallizing can take place. Irregularities in the support surface also appear in the final product.

As a result, where it is desired to employ a vacuum for the direct metallization of a paper support member, the paper is first dried to a level where there will be negligible outgassing. This procedure, however, makes the support material brittle and difficult to process. Additionally, once the vacuum metallization of the dried paper is completed, it is necessary to restore its moisture level to near its original value. This is a time consuming and costly procedure that requires the use of appreciable amounts of energy for drying.

Accordingly, it is an object of the invention to facilitate the metallization of support members, particularly cellulosic products such as paper. A related object is to facilitate the metallization of support members with irregular surfaces. Another related object is to achieve suitable metallization of support members that exhibit outgassing when subjected to a vacuum.

Another object of the invention is to achieve suitable smoothness and reflectivity for metallized support surfaces.

Still another object of the invention is to achieve efficient and high speed metallization of support members.

Still other objects of the invention are to overcome the disadvantages associated with metallization by foil lamination and metallization by vacuum.

One attempt to overcome the foregoing difficulties involves the application of an adhesive with dispersed metallic powder to a support surface. This procedure requires that the metallic laden adhesive be allowed to cure on the support surface. Curing requires that the product be aged for a considerable period of time. The result is a reduction in the efficiency and speed with which the desired metallized product can be produced. Furthermore, metallic powder creates environmental dust objections. There can be the further objection that surface irregularities in the support member are not completely compensated. Finally the dispersion of metallic powder in an adhesive prevents the realization of a continuous metallic film and is accompanied by an inevitable reduction in the reflectivity of the metallized surface. Much of the metal is deposited at an interior level of the adhesive where it is ineffective in the desired reflectance of light.

Accordingly, it is still another object of the invention to achieve suitable metallization of support members having irregular surfaces without the disadvantages associated with the prior art use of metallic powders.

Another object is to achieve the desired metallization without requiring that metallic powder be dispersed in an adhesive which must be allowed to cure.

Still another object of the invention is to increase the efficiency of metallization over and above that which can be achieved by a process which requires curing.

A further object of the invention is to increase the efficiency with which the metal used in metallization contributes to the reflectivity of light from a metallized surface. A related object is to avoid the loss of reflectivity by metallic elements such as powder which becomes embedded below the surface where the reflectivity takes place.

Another object is to metallize a plurality of support sheets simultaneously. A related object is to reduce the cost of achieving support sheet metallization.

SUMMARY OF THE INVENTION

In accomplishing the foregoing and related objects, the invention provides a metallization method in which a support member, such as paper sheeting, receives a metallic film from a plastic sheet carrier.

The metallic film carries a thermoplastic adhesive material, and forms a composite with a paper support. The composite is heated and then calendered by a roll which is desirably chilled. The thermoplastic material serves to compensate for any irregularities in the support surface, and the transferred metallic film is provided with a suitable degree of smoothness by virtue of its contact with a smooth mating surface of the plastic carrier.

In accordance with one aspect of the invention, the metallizable member is a support with a thermoplastic layer, and the transfer member is a plastic sheet with a metallic layer. The plastic sheet is selected from the classes of olefins and polyesters. A particularly suitable olefin is biaxially oriented polypropylene. In the case of polyesters the metallic layer is releasably adhered thereto by a material such as wax.

In accordance with another aspect of the invention, release between the metallic film and plastic sheet carrier is promoted by the inclusion of a vapor coating of a release agent, such as Ouricury wax, between the carrier and the overlying metallic film.

In accordance with a further aspect of the invention, a plurality of support members, such as paper sheeting, simultaneously receive a metallic film from a plastic sheet carrier. The metallic film becomes adhered to each paper support by a thermoplastic adhesive material. The latter serves to compensate for any irregularities in the support surface, and the transferred metallic film is provided with a suitable degree of smoothness by virtue of its contact with a smooth mating suface of the plastic carrier.

In accordance with still another aspect of the invention the plastic sheet carrier has metallic layers on opposite surfaces thereof, is preheated and a composite is formed of the plastic sheet carrier and separate support members, also preheated, facing opposite sides of the carrier.

In accordance with yet another aspect of the invention the thermoplastic adhesive layer is applied to the composite of the support member and the metallized plastic carrier. Where there are a plurality of support members, each is heated separately and the thermoplastic layer appears between each support member and the metallized plastic carrier. The thermoplastic layer in the composite is then subjected to pressure with simultaneous cooling. The pressure is sufficient to produce the desired flow in the preheated and softened thermoplastic layer. If desired, the composite is thereafter further cooled and the plastic sheet stripped away to leave the support member with the metallic film adhered to it by the thermoplastic layer.

In accordance with still another aspect of the invention, the plastic sheet is remetallized and used in the subsequent metallization of other support members. The number of reuses is governed by the thickness of the plastic sheet, with a reuse permitted for each 0.1 mil thickness of the sheet.

In accordance with a further aspect of the invention the support member is a sheet of cellulosic material which is prepared from either mechanical or chemical pulp. The cellulosic sheet desirably is size-press coated on at least the receiving surface for metallization with a water dispersion of clay and resin. The resin is advantageously aqueous styrene butadiene.

In accordance with a still further aspect of the invention the thermoplastic layer is selected from the class consisting of polyolefins, especially polyethylene, styrenes, styrene-polyolefin mixtures, polyamides, nitrostyrenes, vinyl acetate and copolymers including ethylene vinyl acetates, vinyl chlorides, acrylics, and plasticized nitrocelluloses. A particularly suitable thermoplastic layer is a mixture of styrene and vinyl resins being, for example, 80 parts styrene butadiene and 20 parts vinyl acetate, or 80 parts styrene and 20 parts ethylene vinyl acetate.

In accordance with a still further aspect of the invention, the heated and softened thermoplastic is caused to flow by being subjected to pressure at the nip of two rollers which provide a force in the range from about 200 to 1000 pounds per linear inch, preferably 600 pounds per linear inch. The two rollers are cooled so that the thermoplastic layer is first caused to flow and is then rendered nonflowable without the requirement for subsequent additional cooling.

In accordance with a yet further aspect of the invention, the metallizable member is a support with a thermoplastic layer, and the transfer member is a plastic sheet with two metallic layers. The plastic sheet is selected from the class of olefin and polyesters. A particularly suitable olefin is biaxially oriented polypropylene. If the plastic sheet is formed of polyesters, the metallic layers are advantageously releasably adhered thereto by a material such as wax.

In accordance with still another aspect, the invention can be used for the metallization of support members in the form of paper board having a basis weight in the range of from 100 to 400 grams per square meter. This kind of metallization cannot be accomplished economically by conventional techniques.

In accordance with yet another aspect of the invention, the release agent between the plastic carrier and the overlying metallic film includes waxes and wax-like materials.

Natural waxes for the practice of the invention, in addition to Ouricury, which is similar to Carnauba and is obtained from the palm leaf, include Carnauba, which is an exudate from the pores of the leaves of the Brazilian wax palm; condelilla, which is obtained from the Condellilla plant found largely in Mexico; Esparto which is also known as Spanish Grass Wax and is found elsewhere in the Mediterranean region; Sugar Cane Wax made by extraction with Heptane in the production of sugar cane; Montan, which is obtained by extraction from lignite and peat; Ozocerite, also known as Ozokerite, which is a yellowish brown mineral wax occurring naturally as a mixture of solid hydrocarbons; and Beeswax.

The synthetic waxes include those made by purifying Montan wax and synthetic paraffin wax. Another suitable synthetic wax is microwax which is characterized by a microcrystalline structure and is produced in a fashion similar to that of the synthetic paraffins.

Wax-like materials for the practice of the invention include metallic salts of fatty acids of at least eleven carbon atoms and preferably of at least eighteen carbon atoms such as stearates, oleates or linoleates of zinc, calcium, barium, magnesium, aluminum and zirconium. Such wax-like materials are sold in dry or water dispersed form.

DESCRIPTION OF THE DRAWINGS

Other aspects of the invention will become apparent after considering several illustrative embodiments, taken in conjunction with the drawings in which:

FIG. 1 is a fragmentary perspective view of a metallization system in accordance with the invention;

FIG. 1A is a fragmentary diagrammatic view of a metallization system in accordance with an embodiment of the invention wherein separate metallic films are transferred simultaneously from a plastic sheet carrier to separate paper supports;

FIG. 2 is a portion of a metallized plastic carrier for use in the system of FIG. 1;

FIG. 2A is a portion of a metallized plastic carrier for use in the system of FIG. 1A;

FIG. 3 is a fragmentary sectional view of a thermoplastic coated receiver or support sheet for use in the system of FIG. 1;

FIG. 3A is a fragmentary sectional view of a thermoplastic coated receiver or support sheet for use in the system of FIG. 1A;

FIG. 4 is a schematic view of a two-zone direct metallization chamber for preparing the metallized plastic carrier of FIG. 2;

FIG. 4A is a schematic view of a two-zone direct metallization chamber for preparing the metallized plastic carrier of FIG. 2A;

FIG. 5 is a schematic view of a two-zone direct metallization chamber for preparing the metallized plastic carrier of FIG. 2A in a single pass through the chamber;

FIG. 6 is a schematic view of a two-zone direct metallization chamber for preparing a metallized plastic carrier in accordance with the invention; and FIG. 7 is a portion of a metallized plastic carrier produced by the chamber of FIG. 6.

DETAILED DESCRIPTION

With reference to the drawings, a metallization system S in accordance with the invention is shown in fragmentary outline in FIG. 1. The system S makes use of two supply rolls 1 and 2, two heaters 3 and 3A, a pair of calendering drums 4-1 and 4-2, a water cooled drum 6 and rewind rolls 7 and 8.

The supply roll 1 carries a wound carrier sheet 11 of metallized plastic. The metallic side of the sheet 11 carries a thermoplastic coating and faces a receiving or support sheet 21 that is supplied from the lower supply drum 2.

The specific structure of the carrier sheet 11 on the supply drum 1 is shown in detail in FIG. 2. Similarly, the specific structure of the coated receiving sheet 21 is shown in FIG. 3.

The metallized carrier 11 on the upper supply drum 1 is unrolled and extended beneath the lower surface of a heater 3 to an idler roll 9-1. The purpose of the heater 3 is to soften the thermoplastic coating of the sheet 11. Instead of being on the back side, the heater 3 may be positioned alternatively between the sheets 11 and 21.

The receiving or support sheet 21 from the lower supply drum 2 also extends past heater 3A to the intervening idler roll 9-1 where it makes contact with the thermoplastic surface of the carrier 11.

The two sheets 11 and 21 extend from the idler roll 9-1 in contact with one another to the calendering drum 4-1 where pressure is applied by a resilient drum 4-2 at a nip 4n. The calendering drum 4-1 and/or the resilient drum 4-2 can be chilled from a source 5. The drum 4-2 can be of any suitable construction as long as its surface provides suitable resiliency. The composite of the carrier 11 and the support 21 extends from the nip 4n to the lower surface of a cooling drum 6. The purpose of the drum 6 is to assure that the temperature of the composite is reduced to a suitable level before separation of the two sheets 11 and 21 which takes place at the upper surface of a second idler roll 9-2.

The separated sheets are wound on respective takeup rolls 7 and 8 with the sheet 11' on the upper roll 8 being devoid of its metallic layer which has been transferred to the metallized sheet 21' that is wound on the lower roll 7. The resulting metallized sheeting 21' is subsequently removed with the lower roll 7.

It will be understood that the various rolls 1, 2, 9-1, 9-2, 7 and 8 are supported in conventional fashion. The various rolls are also of a diameter that is appropriate for the stock being processed. As the basis weight of the stock increases, the diameters of the associated rolls are increased correspondingly.

As can be seen from the detailed fragment in FIG. 2, the metallized plastic carrier 11 includes a plastic substrate 12, a metallic coating 13, and a thermoplastic layer 14. Similar details for the receiver support 21 are shown in FIG. 3. The coated paper sheet 21 is constituted by a base paper layer 22, a size press coating 24, and a bonding interface 23 between the coating 24 and the base paper 22. It is to be noted that the thermoplastic layer 14 faces the coating 24 of the sheet 11 in FIG. 1.

Metallization of the plastic substrate 12 of the composite 11 in FIG. 2 can be achieved in a chamber C as illustrated in FIG. 4. A supply drum wound with a plastic sheet 12 has its sheet extended over an idler roll I around the periphery of a water cooled drum, and then about a second idler roll $I_2$ to a rewind drum. The chamber "C" is divided into two zones; the first zone, which is semicylindrical, is at a pressure $P_1$ and the remaining semicylindrical zone is at a pressure $P_2$, where the pressure $P_2$ is lower than pressure $P_1$. Consequently, conventional seals $S_1$ and $S_2$ are used to retain the pressure differential between the two portions of the chamber C where the sheet 12 from the supply drum enters and then leaves as metallized sheet 11. In the metallizing portion, metal, for example aluminum, is vaporized as represented by the symbol AL and allowed to accumulate on the plastic sheet 12 as the layer 13.

In another embodiment of the invention as illustrated best by FIGS. 1A to 5, separate metallic films are transferred simultaneously to separate paper supports from a plastic sheet carrier and adhered to the respective paper supports by a thermoplastic material.

With reference to the drawings, a metallization system S in accordance with the invention is shown in fragmentary outline in FIG. 1A. The system S makes use of three supply rolls 1, 2 and 3, three heaters 12, 22 and 32, a calendering drum 4-1, a contacting resilient drum 4-2, a cooling drum 7 and rewind rolls 8, 9 and 10.

The supply roll 1 carries a wound carrier sheet 11 of a plastic sheet that is metallized on opposite sides. Each metallic side of the sheet 11 faces a thermoplastic coating on receiving and support sheets 21 and 31 that is supplied from drums 2 and 3.

The specific structure of the carrier sheet 11 on the supply drum 2 is shown in detail in FIG. 2A. Similarly, the specific structure of the coated receiving sheets 21 and 31 are shown in detail in FIG. 3A. The structures are like those of FIGS. 2 and 3 except for the replication of the layers 13 and 14 in layers 13' and 14'.

The metallized carrier 11 on the intermediate supply drum is unrolled and extended to the lower surface of the calendering drum 4 beneath a heater 12.

The receiving or support sheets 21 and 31 from the upper and lower supply drums 2 and 3 also extend beneath respective heaters 22 and 32 into contact with the respective metallized surfaces of the carrier 11. The three sheets 11, 21, and 31 are subjected to pressure by the resilient drum 4-2 and then extend in contact with one another to the cooling drum 7. The drum 4-2 can be of any suitable construction as long as its surface provides suitable resiliency. The composite of the carrier 11 and the supports 21 and 31 extend from the nip of the drums 4-1 and 4-2 to the lower surface of the drum 7. The purpose of the drum 7 is to lower the temperature of the composite to a suitable level before separation of the sheets 11, 21 and 31 takes place at the upper surface of an idler roll 6. Either or both of the drums 4-1 and 4-2 may be chilled.

The separated sheets are wound on respective takeup rolls 8, 9 and 10 with the sheet 11' on the central roll 9 being devoid of its metallic layers, which have been transferred to the metallized sheets 21' and 31' that are wound on the respective upper and lower rolls 8 and 10. The resulting metallized sheetings 21' and 31' are subsequently removed with the upper and lower rolls 8 and 10.

it will be understood that the various rolls 1-10 are supported in conventional fashion. The various rolls are also of a diameter that is appropriate for the stock being processed. As the basis weight of the stock increases, the diameters of the associated rolls are increased correspondingly. In addition, chilling of the drums 4-1, 4-2, and 7 is accomplished conventionally.

As can be seen from the detailed fragment in FIG. 2A, the metallized plastic carrier 11 includes a plastic substrate 12 and opposed metallic coatings 13 and 14. Similar details for the identical receiver supports 21 and 31 are shown in FIG. 3, for the illustrative support 21. The coated paper sheet 21 is constituted by a base paper layer 22, a thermoplastic coating 24, and diffusion bonding layer 23 between the thermoplastic coating 24 and the base paper 22. It is to be noted that the thermoplastic layer 24 faces the metallic coating 13 (or 14) of the sheet 21 (or 31) in FIG. 1A.

Metallization of the plastic substrate 12 of the composite 11 in FIG. 2A can be achieved using a chamber C illustrated in FIG. 4A. A supply drum wound with a plastic sheet 12 has its sheet extended over an idler roll $I_1$ around the periphery of a water cooled drum, and then about a second idler roll $I_2$ to a rewind drum. The chamber "C" is divided into two zones; the first zone, which is semicylindrical, is at a pressure $P_1$ and the remaining semicylindrical zone is at a pressure $P_2$, where the pressure $P_2$ is lower than pressure $P_1$. Consequently, conventional seals $S_1$ and $S_2$ are used to retain the pressure differential between the two portions of the chamber C where the sheet 12 from the supply drum enters and then leaves as metallized sheet 11. In the metallizing portion, metal, for example aluminum is vaporized as represented by the symbol AL and allowed to accumulate on one surface of the plastic sheet 12 to form the layer 13. The rewind drum is then removed and substituted for the supply drum, and the metallized sheet 11, with the metallic coating 13 is extended into the remaining semicylindrical section with the metallic layer 13 facing the water cooled drum. The subsequent metallization that occurs then creates the remaining metallized layer 14.

Alternatively, the metallized plastic carrier 11 of FIG. 2 can be prepared with metallic layers 13 and 14 deposited on opposite sides of the carrier in a single pass using the metallization chamber C' illustrated in FIG. 5. As in the case of FIG. 4A, the chamber C' is divided into two semicylindrical zones at respective pressures $P_1$ and $P_2$, with the pressure $P_2$ being lower than the pressure $P_1$. By contrast with FIG. 4A, the chamber C' of FIG. 5 includes two water cooled drums $D_1$ and $D_2$. A plastic carrier 12 from the supply roll is extended from the zone $P_1$ around the first water cooled drum $D_1$ into the second zone $P_2$ and then out of the zone over an idler roll $I_3$, returning into the second zone $P_2$ over the second water cooled drum $D_2$. The metallic layer 13 of FIG. 2 is applied to the carrier 12 by vapor deposition of metal as the carrier travels about the first water cooled drum $D_1$ in the second zone $P_2$. Subsequently the remaining metallic layer 14 is deposited on the opposite side of the carrier 12 as the carrier returns to the second zone, with its opposite side already metallized, and travels about the second water cooled drum $D_2$. The two-sided metallized carrier 11 is then collected on the rewind roll in the first zone $P_1$.

In accordance with another embodiment of the invention, a metallization chamber C for use in accordance with the invention is shown in fragmentary outline in FIG. 6.

With reference to FIG. 6, metallization of a plastic carrier 12 is achieved in the chamber C. A supply drum has its polyester sheet 12 extended over an idler roll $I_1$ around the periphery of a water cooled drum, and then about a second idler roll $I_2$ to a rewind drum. The chamber C is divided into two zones, the first zone, which is semicylindrical, is at a pressure $P_1$ and the remaining semicylindrical zone is at a pressure $P_2$, lower than pressure $P_1$. In the first zone, which may be at a pressure as high as 0.1 Torr to 0.01 Torr a naturally occurring Ouricury wax is evaporated (designated by the symbol $\Delta W$ in FIG. 6) and condensed as an invisible layer on the polyester. It will be understood that the wax serves a release function for a subsequently applied aluminum layer which is evaporated and condensed on the wax coated surface in the second section. Any material which provides the desired release function may be employed including both natural and synthetic waxes and wax-like materials.

Natural waxes for the practice of the invention include Carnauba, which is an exudate from the pores of the leaves of the Brazilian wax palm; condelilla, which is obtained from the Condelilla plant found largely in Mexico; Esparto which is also known as Spanish Grass Wax and is found elsewhere in the Mediterranean region; Sugar Cane Wax made by extraction with heptane in the production of sugar cane; Ouricury, which is similar to Carnauba and is obtained from the palm leaf; Montan, which is obtained by extraction from lignite and peat; Ozocerite, also known as Ozokerite, which is a yellowish brown mineral wax occurring naturally as a mixture of solid hydrocarbons; and Beeswax.

The synthetic waxes include those made by purifying Montan wax and synthetic paraffin wax. Another suitable synthetic wax is microwax which is characterized by a microcrystalline structure and is produced in a fashion similar to that of the synthetic paraffins.

Wax-like materials for the practice of the invention include metallic salts of fatty acids of at least eleven carbon atoms and preferably of at least eighteen carbon atoms such as stearates, oleates or linoleates of zinc, calcium, barium, magnesium, aluminum and zirconium. Such wax-like materials are sold in dry or water dispersed form.

Conventional seals $S_1$ and $S_2$ are used to retain the pressure differential between the two portions of the chamber C where the sheet 12 from the supply drum enters and then leaves as metallized sheet 11. In the metallizing portion, metal, for example aluminum is vaporized as represented by the symbol $\Delta AL$ and allowed to accumulate on the plastic sheet 12 to form the metallic layer 13. As can be seen from the detailed fragment in FIG. 7, the metallized polyester carrier 11 includes a plastic substrate 12, a metallic coating 13, and a release layer 14. The metallic coating 13 of polyester carrier 11 of FIG. 7 is transferable to receiver support 21 of FIG. 3 by utilization of system S of FIG. 1 as described in the foregoing.

The invention is further illustrated with reference to the following illustrative examples which are to be taken as nonlimiting.

EXAMPLE I

Ground wood (mechanical pulp) paper sheeting of standard basis weight is size-press coated in conventional fashion. The coated paper sheeting is then provided with a heated thermoplastic layer having a weight of 4 grams per square meter. If the sheeting is precoated, the thermoplastic layer is subjected to separate heating.

Plastic sheeting that has a metallic layer with a thickness of about 200 angstroms has its metallic surface brought into contact with the heated thermoplastic layer of the paper sheeting.

The composite of the thermoplastic layer, the paper sheeting and the metallized plastic sheeting is then simultaneously calendered and cooled and the plastic sheeting peeled away, transferring the metallic layer to the paper sheeting by virtue of the adhesive effect of the thermoplastic layer.

The result is a metallized sheet of paper with a high and acceptable degree of reflectivity, with the metallic layer stripped away from the plastic sheeting, which is reusable.

This example is repeated with two coated paper sheetings prepared, each with a heated thermoplastic layer having a weight of 4 grams per square meter. The plastic sheeting has metallic layers of 200 angstrom thickness on opposed surfaces and has its metallic surfaces brought into contact with heated thermoplastic layers of the respective paper sheetings.

EXAMPLE IA

Example I is repeated with the thermplastic layer heated to a temperature from about 25° F. below the temperature at which the layer will heat seal to itself, to about 50° F. above its softening temperature. The results are substantially the same as for Example I.

EXAMPLE II

Example I is repeated with the plastic sheeting remetallized on one surface or on opposite surfaces and used to transfer a metallic layer to one or two different paper carriers respectively for each remetallization.

The result in each case is a metallized paper sheet with a high and acceptable degree of reflectivity.

EXAMPLE III

Example II is repeated according to the thickness of the plastic sheeting, with one reuse per 0.1 mil thickness of the sheeting, so that a 0.5 mil thickness permitted five reuses and a 0.9 mil thickness permitted nine reuses. In each case the metallized paper exhibits suitable reflectivity.

EXAMPLE IV

The preceding examples are repeated using ground wood paper sheeting having a basis weight in the range from about 40 to 70 grams per square meter, and preferably about 60 grams per square meter. The results are substantially the same as for Example I.

EXAMPLE V

The preceding examples are repeated using paper board having a basis weight in the range from about 100 to 400 grams per square meter. The results are substantially the same as for Example I.

EXAMPLE VI

The preceding examples are repeated using a size press coating on at least one side with a water dispersion of clay and resin to provide a holdout surface for the thermoplastic layer. The results are substantially the same as for Example I.

EXAMPLE VII

The preceding examples are repeated using a size-press coating in which the resin is aqueous styrene butadiene. The results are substantially the same as for Example I.

EXAMPLE VIII

The preceding examples are repeated in which the thermoplastic layer is plastic provided by a mixture of styrene and vinyl resins. The results are substantially the same as for Example I.

EXAMPLE IX

Example VII is repeated using a water-based thermoplastic layer of 80 parts styrene butadiene, for example Dow No. 620, with 20 parts vinyl acetate, for example Borden No. 2142. The results are substantially the same as in Example I.

EXAMPLE X

The preceding examples are repeated with the thermoplastic layer being provided by a coating emulsion in water of ethylene vinyl acetate and styrene.

EXAMPLE XA

Examples I-VII are repeated in which the thermoplastic layer is a polyolefin selected from the classes of low density polyethylenes, high density polyethylenes, linear low density polyethylenes, polypropylene, and oxidized polyethylene and is applied by hot melt or extrusion coating techniques to the paper sheeting. The results are substantially the same as for Example I.

EXAMPLE XI

The preceding examples are repeated with the coated paper sheeting and thermoplastic layer dried to a moisture content in the range from about 2–13 percent, with 6 percent being preferred.

EXAMPLE XII

The preceding examples are repeated with the plastic sheeting selected from the class of olefins, including in particular polypropylene which has at least a uniaxial orientation, and preferably a biaxial orientation, for example Hercules biaxial polypropylene film sold under the trademark and trade name "B-503 BOP".

EXAMPLE XIII

The preceding examples are repeated with the paper and the plastic sheeting being advanced during processing at a speed ranging between 200 and 1000 fpm with a speed of 600 fpm being preferred.

EXAMPLE XIV

The preceding examples are repeated with the composite of the coated paper sheeting and the metallized plastic sheeting being cooled to about room temperature by a water cooled drum.

EXAMPLE XV

The preceding examples are repeated with chemical pulp paper, achieving the same degree of reflectivity as Example I with less metal.

EXAMPLE XVI

The preceding examples are repeated with a plastic sheeting of polyester which is provided with a release coating before metallization.

EXAMPLE XVII

Example I is repeated with the plastic sheeting being subjected to corona treatment before metallization.

EXAMPLE XVIII

The preceding examples are repeated with a metallic thickness in the range from about 100 to 500 angstroms.

EXAMPLE XIX

The preceding examples are repeated with a metallic thickness having a resistance in the range from about ½ ohm per square to about 5 ohms per square, with 2 ohms per square being preferred.

EXAMPLE XX

The preceding examples are repeated with the thermoplastic layer being selected from the class consisting of styrenes, styrene-polyolefin mixtures, acrylics, polyamides, nitrostyrenes, vinyl acetates and copolymers, including ethylene vinyl acetate, vinyl chlorides, and plasticized nitrocelluloses or mixtures.

EXAMPLE XXI

The preceding examples are repeated with the preliminary coating of the paper sheeting being made uniformly on opposed surfaces.

EXAMPLE XXII

The preceding examples are repeated with the composite of the coated paper sheeting and the metallized plastic sheeting being heated in the range from about 230° F. to about 275° F., with 255° F. being preferred.

EXAMPLE XXIII

The preceding examples are repeated with a force applied at the nip of two contacting rollers in the range from about 400 to about 1000 pounds per linear inch, with a force of 600 pounds per linear inch being preferred.

While various aspects of the invention have been set forth by the drawings and the specification, it is to be understood that the foregoing detailed description is for illustration only and that various changes in parts, as well as the substitution of equivalent constituents for those shown and described, may be made without departing from the spirit and scope of the invention as set forth in the appended claims.

I claim:

1. The method of metallizing a support member which comprises:
   (a) forming a heated composite of a support member to be metallized and a metallized sheet, with a thermoplastic layer therebetween, said metallized sheet having a metal layer to be transferred and a carrier sheet;
   (b) heating the composite sufficiently to soften the thermoplastic and then immediately pressing and cooling the composite from both sides by calendering the composite between chilled calender rolls; and
   (c) thereafter separating the carrier from the metallized sheet.

2. The method of claim 1 wherein said heated composite is calendered and cooled simultaneously.

3. The method of claim 1 wherein said thermoplastic layer is applied to said metallized sheet before said composite is formed.

4. The method of claim 1 wherein said sheet is of plastic and is metallized on opposite surfaces thereof, and said composite includes a second support member with a second thermoplastic layer facing the opposite surface of the metallized sheet.

5. The method of claim 1 wherein the plastic sheet is remetallized and reused for the metallization of other support members.

6. The method of claim 5 wherein the number of resuses of said plastic sheet is proportional to the thickness thereof.

7. The method of claim 6 wherein a reuse of said plastic sheet is made for each 0.1 mil thickness thereof.

8. The method of claim 1 wherein said release layer is selected from the class of natural waxes consisting of Ouricury, Carnauba, Condelilla, Esparto, Sugar Cane, Montan, Ozocerite, synthetic waxes made by purifying Montan wax and synthetic paraffin wax, microwax characterized by a microcrystalline structure and wax-like materials consisting of metalin salts of fatty acids of at least eleven carbon atoms, consisting of stearates, oleates or linoleates of zinc, calcium, barium, magnesium, aluminum and zirconium.

9. The method of claim 1 wherein said support member and said metallized sheet are heated before calendering.

10. The method of claim 1 wherein said support member and said metallized sheet are heated separately before calendering.

11. The method of claim 1 wherein either the metallized sheet or the support member is heated before calendering.

12. The method of claim 1 wherein said heating is by radiant energy.

13. The method of claim 1 wherein said thermoplastic adhesive layer is heated before the calendering of said composite.

14. The method of claim 1 wherein said support member is pre-heated.

15. The method of claim 1 wherein said metallized sheet is pre-heated before step (a).

16. The method of claim 1 wherein said pre-heating is by radiant heating.

* * * * *